United States Patent
Shim et al.

(10) Patent No.: US 9,034,682 B2
(45) Date of Patent: May 19, 2015

(54) BACKSIDE ILLUMINATED IMAGE SENSOR AND METHOD OF MANUFACTURING THE SAME

(75) Inventors: Eun-Sub Shim, Anyang-si (KR);
Jung-Chak Ahn, Yongin-si (KR);
Bum-Suk Kim, Hwaseong-si (KR);
Kyung-Ho Lee, Bucheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 884 days.

(21) Appl. No.: 13/177,253

(22) Filed: Jul. 6, 2011

(65) Prior Publication Data
US 2012/0009720 A1    Jan. 12, 2012

(30) Foreign Application Priority Data
Jul. 7, 2010 (KR) ........................ 10-2010-0065467

(51) Int. Cl.
*H01L 31/0232* (2014.01)
*H01L 27/146* (2006.01)

(52) U.S. Cl.
CPC ...... *H01L 27/1464* (2013.01); *H01L 27/14625* (2013.01); *H01L 27/14685* (2013.01); *H01L 27/14687* (2013.01)

(58) Field of Classification Search
None
See application file for complete search history.

(56) References Cited

U.S. PATENT DOCUMENTS

| | | | |
|---|---|---|---|
| 2003/0156210 A1* | 8/2003 | Wako et al. | 348/273 |
| 2006/0268143 A1* | 11/2006 | Boettiger et al. | 348/340 |
| 2007/0126905 A1* | 6/2007 | Kobayashi | 348/311 |
| 2011/0309236 A1* | 12/2011 | Tian et al. | 250/208.1 |

FOREIGN PATENT DOCUMENTS

| | | |
|---|---|---|
| JP | 2009-200279 A | 9/2009 |
| JP | 2009-206356 A | 9/2009 |
| KR | 10-2008-0014301 A | 2/2008 |
| KR | 10-2008-0069901 A | 7/2008 |

* cited by examiner

*Primary Examiner* — Seahvosh Nikmanesh
(74) *Attorney, Agent, or Firm* — Lee & Morse, P.C.

(57) ABSTRACT

A method of manufacturing a backside illuminated image sensor, including forming a first isolation layer in a first semiconductor layer, such that the first isolation layer defines pixels of a pixel array in the first semiconductor layer, forming a second semiconductor layer on a first surface of the first semiconductor layer, forming a second isolation layer in the second semiconductor layer, such that the second isolation layer defines active device regions in the second semiconductor layer, forming photo detectors and circuit devices by implanting impurities into a first surface of the second semiconductor layer, the first surface of the second semiconductor layer facing away from the first semiconductor layer, forming a wiring layer on the first surface of the second semiconductor layer, and forming a light filter layer on a second surface of the first semiconductor layer.

21 Claims, 11 Drawing Sheets

FIRST SUPPORTING SUBSTRATE

BACKSIDE ILLUMINATED IMAGE SENSOR AND METHOD OF MANUFACTURING THE SAME

CROSS-REFERENCE TO RELATED APPLICATIONS

This application claims the benefit of Korean Patent Application No. 10-2010-0065467, filed on Jul. 7, 2010, in the Korean Intellectual Property Office, and entitled: "Backside Illuminated Image Sensor and Method of Manufacturing the Same," the disclosure of which is incorporated herein in its entirety by reference.

BACKGROUND

1. Field

The inventive concept relates to an image sensor and a method of manufacturing the same, and more particularly, to a backside illuminated image sensor for minimizing crosstalk between adjacent pixels and a method of manufacturing the same.

2. Description of the Related Art

Recently, a backside illuminated image sensor, i.e., a device that converts an optical image to electric signals by forming a wiring layer on a front surface of a semiconductor layer and transmitting light incident on a rear surface of the semiconductor layer, has been introduced. Generally, an image sensor includes a pixel array, and each of the pixels in the pixel array includes a photo diode for photoelectric conversion. Furthermore, each of pixels includes a color filter, so each of the photo diodes of the pixels performs photoelectric conversion with respect to light having a particular wavelength.

SUMMARY

The inventive concept provides a backside illuminated image sensor for preventing crosstalk between pixels.

According to an aspect of the inventive concept, there is provided a backside illuminated image sensor includes a first semiconductor layer having a front surface and a rear surface; a first isolation layer having a predetermined depth and defining pixels of the pixel array in the first semiconductor layer; a second semiconductor layer on the front surface of the first semiconductor layer; a second isolation layer defining photo detector regions and circuit device regions in the second semiconductor layer; a wiring layer formed on the surface of the second semiconductor layer not facing the first semiconductor layer; and a light filter layer formed on the rear surface of the first semiconductor layer.

According to another aspect of the inventive concept, there is provided a method of manufacturing a backside illuminated image sensor having a pixel array, the method including forming a first isolation layer in a first semiconductor layer, such that the first isolation layer defines pixels of the pixel array in the first semiconductor layer, forming a second semiconductor layer on a first surface of the first semiconductor layer, forming a second isolation layer in the second semiconductor layer, such that the second isolation layer defines active device regions in the second semiconductor layer, forming photo detectors and circuit devices by implanting impurities into a first surface of the second semiconductor layer, the first surface of the second semiconductor layer facing away from the first semiconductor layer, forming a wiring layer on the first surface of the second semiconductor layer, and forming a light filter layer on a second surface of the first semiconductor layer, the second surface of the first semiconductor layer being opposite the first surface of the first semiconductor layer.

Forming the second semiconductor layer may include using an epitaxial method.

The first semiconductor layer may be formed by using an epitaxial method.

Forming the light filter layer may include forming the first semiconductor layer on a first supporting substrate, forming a second supporting substrate on a surface of the wiring layer facing away from the second semiconductor layer, removing the first supporting substrate from the first semiconductor layer, forming a color filter layer on the second surface of the first semiconductor layer, and forming a lens layer on the color filter layer.

Forming the first isolation layer may include forming a trench-type insulation layer.

Forming the first isolation layer may include using a material having a refraction index lower than that of a material of the first semiconductor layer.

The first isolation layer may be formed to extend from the first surface of the first semiconductor layer toward the second surface of the first semiconductor layer, a length of the first isolation layer being substantially equal a thickness of the first semiconductor layer.

The first isolation layer may be formed to extend from the first surface of the first semiconductor layer toward the second surface of the first semiconductor layer, a length of the first isolation layer being shorter than a thickness of the first semiconductor layer.

The first isolation layer may be formed to have a lattice structure surrounding each of the pixels of the pixel array.

The photo detectors may be formed to be aligned with corresponding micro-lenses of the lens layer.

A center of each of the photo detectors may be aligned with a center of each corresponding pixel of the pixel array.

Each photo detector may be a photo diode, a photo transistor, a photo gate, or a pinned photo diode (PPD).

Active regions of the circuit devices may be formed to be symmetric around an imaginary line extending from the first isolation layer.

A first part of the photo detector may be formed in the first semiconductor layer and a second part of the photo detector is formed in the second semiconductor layer.

At least two of the pixels may share a floating diffusion (FD) region.

The circuit devices may include transmitting transistors for transmitting charges accumulated in the corresponding photo detectors to the corresponding FD regions, resetting transistors for initializing potentials of the corresponding FD regions, driving transistors for amplifying changes of potentials of the corresponding FD regions, and selecting transistors for outputting output signals of the corresponding driving transistors in response to corresponding row selecting signals.

According to another aspect of the inventive concept, there is provided a method of manufacturing a backside illuminated image sensor having a pixel array, the method including forming an isolation layer in a semiconductor substrate, such that the isolation layer defines pixels of the pixel array in the semiconductor substrate, forming a photo detector in each pixel, such that the isolation layer separates adjacent photo detectors, forming a wiring layer on the semiconductor substrate, and forming a light filter layer on the semiconductor substrate, such that the semiconductor substrate with the photo detectors is between the wiring layer and the light filter layer.

The light filter layer may be formed directly on the semiconductor substrate.

Forming the isolation layer in the semiconductor substrate may include forming a first isolation layer in a first semiconductor layer of the semiconductor substrate to define the pixels, forming a second isolation layer in a second semiconductor layer of the semiconductor substrate, such that the second semiconductor layer is on the first semiconductor layer, and such that the second isolation layer has a different pattern than the first isolation layer, and forming the photo detectors by implanting impurities into a first surface of the second semiconductor layer, the first surface of the second semiconductor layer facing away from the first semiconductor layer.

Forming the first isolation layer may include forming first trenches with an insulation material between adjacent pixels, such that the first trenches extend over at least a majority of a thickness of the first semiconductor layer to completely overlap the photo detectors in the pixels, and forming the second isolation layer includes forming second trenches with an insulation material, such that the second trenches define regions for active devices, and such that the regions for active devices do not overlap the photo detectors.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
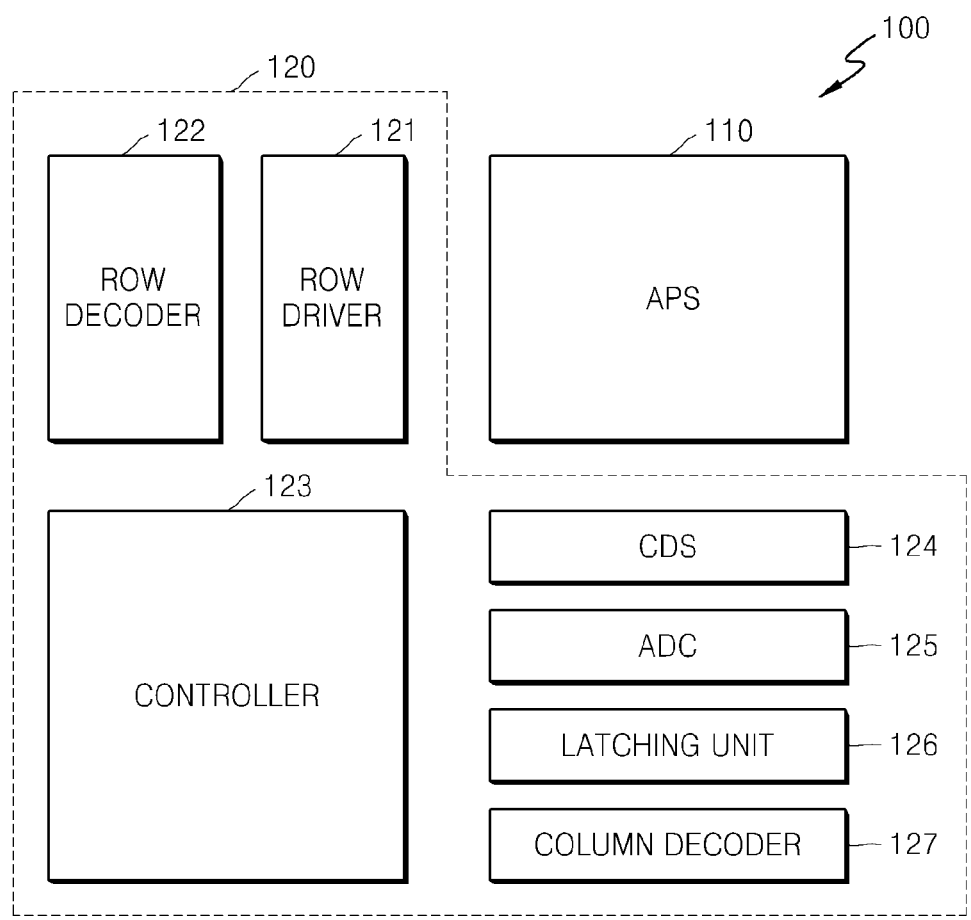
FIG. 1 illustrates a block diagram of a backside illuminated image sensor according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
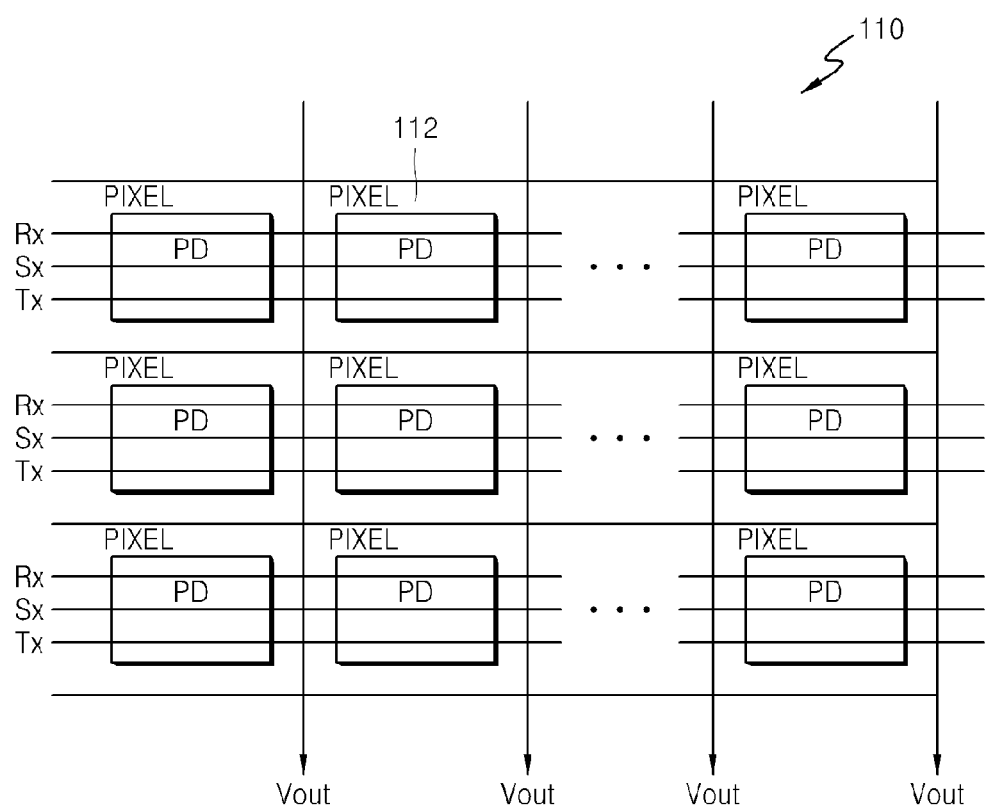
FIG. 2 illustrates a circuit diagram of an active pixel sensor (APS) array of backside illuminated image sensors according to an embodiment of the inventive concept.
Figure 3:
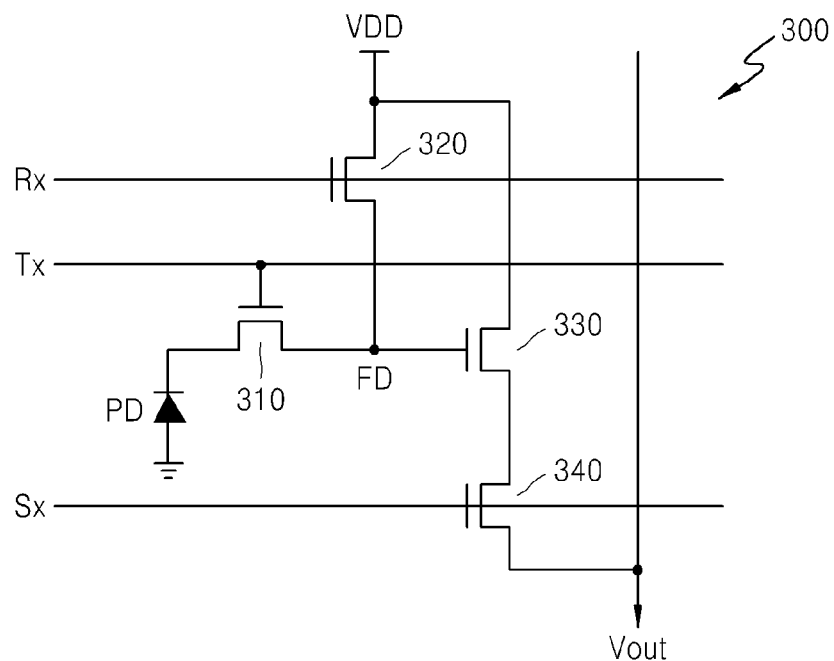
FIG. 3 illustrates a circuit diagram of a pixel of a backside illuminated image sensor according to an embodiment of the inventive concept.

FIG. 1 is a block diagram of a backside illuminated image sensor 100 according to an embodiment of the inventive concept. FIG. 2 is a circuit diagram of an active pixel sensor (APS) array region 110 of the backside illuminated image sensor 10, and FIG. 3 is a circuit diagram of a unit pixel 300 of the backside illuminated image sensor 100.

Referring to FIG. 1, the backside illuminated image sensor 100 according to the present embodiment may include the APS array region 110 and a control circuit region 120 for driving the APS array region 110. As shown in FIG. 2, the APS array region 110 may include a plurality of pixels arranged in a 2-dimensional matrix to constitute the APS array region 110, and a photo detector PD arranged in each of the plurality of pixels. The pixels may each be the unit pixel 300 configured as shown in the equivalent circuit diagram of FIG. 3. The APS array region 110 converts optical signals to electrical signals and is driven by receiving various driving signals, e.g., a pixel selecting signal Sx, a resetting signal Rx, and a transmitting signal Tx, from a row driver 121. Furthermore, converted electrical signals are provided to a correlated double sampler (CDS) 124 via a vertical signal line (an output line Vout in FIG. 2). The control circuit region 120 may include a controller 123, a row decoder 122, the row driver 121, the CDS 124, an analog-digital converter (ADC) 125, a latching unit 126, and a column decoder 127.

The controller 123 provides control signals to the row decoder 122 and to the column decoder 127. Based on a result of decoding performed by the row decoder 122, the row driver 121 provides a plurality of driving signals to the APS array region 110 for driving the pixels 300. Generally, when pixels are arranged in a matrix, a driving signal is provided to each of the rows.

The CDS 124 receives electrical signals formed in the APS array region 110 via the vertical signal line (the output line Vout of FIG. 2) and samples and holds the received electrical signals. In addition, a difference level corresponding to a difference between a noise level and a signal level is generated and is output by sampling both a particular noise level and a signal level.

The ADC 125 converts an analog signal corresponding to a difference level output by the CDS 124 into a digital signal. The latching unit 126 latches digital signals, and the latched signals are sequentially output to an image signal processing unit (not show n) based on a result of decoding performed in the column decoder 127.

Although FIG. 3 shows a case where the unit pixel 300 has a structure including four transistors, the pixels 300 may have a structure including three transistors, a structure including five transistors, or a photo gate structure similar to the structure including four transistors.

Referring to FIG. 3, each of the pixels 300 having a structure including four transistors may include the photo detector PD, which receives light and generates and stores photogenerated charges, and active devices that transmit and process optical signals incident on the photo detector PD. The active devices may include, e.g., a transmitting device 310, a resetting device 320, a driving device 330, and a selecting device 340.

The photo detector PD generates and stores charges corresponding to light incident thereon. The photo detector PD may be, e.g., a photo diode, a photo transistor, a photo gate, a pinned photo diode (PPD), or a combination thereof. Furthermore, the photo detector PD is connected to the transmitting device 310, which transmits the photogenerated charges stored in the photo detector PD to a floating diffusion (FD) region.

The FD region receives charges generated by and stored in the photo detector PD. Furthermore, the FD region is electrically connected to the driving device 330, e.g., a driving transistor, and controls the driving device 330.

The transmitting device 310, e.g., a transmitting transistor, transmits charges from the photo detector PD to the FD region. The transmitting device 310 is controlled by the transmitting signal Tx.

The resetting device 320, e.g., a resetting transistor, periodically resets the FD region. A source of the resetting device 320 is connected to the FD region, and a drain of the resetting device 320 is connected to a source for supplying a power voltage VDD. Furthermore, the resetting device 320 is driven by the resetting signal Rx. Therefore, when the resetting device 320 is turned on by the resetting signal Rx, the power voltage VDD, supplied by the source connected to the drain of the resetting device 320, is transmitted to the FD region.

The driving device 330, e.g., a driving transistor, functions as a source follower buffer amplifier in combination with a constant current source (not shown) disposed outside the pixels 300 and amplifies a variation of an electrical potential of the FD region, to which photogenerated charges stored in the photo detector PD is transmitted, and outputs the amplified electrical potential to the output line Vout.

The selecting device 340, e.g., a selecting transistor, selects a row of the pixels 300 to be read out as a unit. The selecting device 340 is driven by a bias provided by the row selecting line Sx.

Furthermore, the driving signal lines Tx, Rx, and Sx of the transmitting device 310, the resetting device 20, and the selecting device 340 may extend in a row direction, that is, a horizontal direction, so that the pixels 300 included in the same row may be driven at the same time.

Operation of the circuit of the unit pixel 300 shown in FIG. 3 will be described below. First, when the transmitting transistor 310 and the resetting transistor 320 are turned on, the power voltage VDD is transmitted to the FD region. Next, the transmitting transistor 310 and the resetting transistor 320 are turned off and the photo detector PD accumulates charges for a predetermined period of time. Charge accumulation refers to a process in which electron hole pairs (EHP) are generated according to light externally incident on the photo detector PD. Due to charges accumulated as described above, a potential of a source of the transmitting transistor 310 is changed according to an amount of the generated charges. When the transmitting transistor 310 is turned on by the transmitting signal Tx input to a gate of the transmitting transistor 310, the accumulated charges are transmitted to the FD region, and the potential of the FD region is changed according to an amount of the transmitted charges. Based on a change in the potential of the FD region, a gate bias of the driving transistor 330 is changed. As a result, a potential of a source of the driving transistor 330 is changed. The driving transistor 330 is a source follower transistor, and it functions as a type of signal amplifier. Here, when the selecting transistor 340 is turned on by the pixel selecting signal Sx, a signal amplified by the driving transistor 330 is output outside via the output Vout. The resetting transistor 320 is turned on or off by the resetting signal Rx. When the resetting transistor 320 is turned on, the potential of the FD region becomes equal to the power voltage VDD that may be output as the reference voltage. In other words, the resetting transistor 320 initializes the unit pixel 300.

Figure 4:
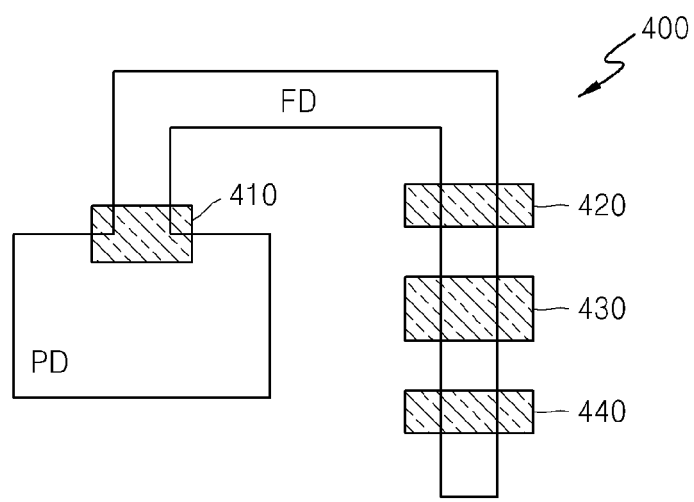
FIG. 4 illustrates a diagram of a layout of a pixel in FIG. 3.

FIG. 4 is a diagram showing a layout of a pixel as shown in FIG. 3.

Referring to FIGS. 2 and 4, the pixels are arranged in a matrix shape in the APS array region 110, and thus a substrate may be divided into rectangular areas with pixels 112. Furthermore, a photo detector PD is arranged in each of the pixels 112 (FIG. 2), so the FD region, a transmitting transistor 410, a resetting transistor 420, a driving transistor 430, and a selecting transistor 440 for transmitting and processing signals photoelectrically converted by the photo detector PD may be arranged around the photo detector PD.

FIGS. 5 through 8 are cross-sectional views of backside illuminated image sensors 500, 600, 700, and 800 according to embodiments of the inventive concept.

Referring to FIGS. 5 through 8, the backside illuminated image sensors 500, 600, 700, and 800 are backside illuminated image sensors having light incident on rear surfaces of respective semiconductor substrates 560, 660, 760, and 860. The semiconductor substrates 560, 660, 760, and 860 may include first semiconductor layers 530, 630, 730, and 830, respectively, and second semiconductor layers 540, 640, 740, and 840, respectively. Each first semiconductor layer 530, 630, 730, or 830 may be between the rear surface of a respective semiconductor substrate 560, 660, 760 and 860, and a corresponding second semiconductor layer 540, 640, 740, or 840.

The backside illuminated image semiconductor sensors 500, 600, 700, and 800 include wiring layers 550, 650, 750, and 850, substrates 560, 660, 760, and 860, and light filter layers 570, 670, 770, and 870, respectively. In detail, the light filter layers 570, 670, 770, and 870 are arranged on the rear surfaces of the semiconductor substrates 560, 660, 760, and 860, respectively, and the wiring layers 550, 650, 750, and 850 are arranged on front surfaces of the semiconductor substrates 560, 660, 760, and 860, respectively. For example, the substrate 560 and the light filter layer 570 may be sequentially stacked on the wiring layer 550, e.g., the second semiconductor layer 540 may be between the wiring layer 550 and the first semiconductor layer 530, so the light filter layer 570 and the wiring layer 550 are on opposite surfaces of the backside illuminated image semiconductor sensor 500. The backside illuminated image semiconductor sensors 600, 700, and 800 may have substantially same structures with respect to their respective substrates, light filter layers, and wiring layers.

When an image sensor receives light via a front surface of a semiconductor layer, the light may pass through a thick interlayer insulation layer. Therefore, a large amount of the light incident on the front surface of the semiconductor layer may be absorbed or lost, so an amount of finally concentrated light, e.g., reaching a photo detector element, is limited. Especially, red light having relatively long wavelengths is not only lost, but also significantly refracted, if the red light passes through a thick interlayer insulation layer. Thus, optical crosstalk, i.e., a phenomenon in which light incident on a photo diode of a particular pixel is also incident on an adjacent pixel, is significantly accumulated in adjacent pixels.

In the backside illuminated image sensors 500, 600, 700, and 800 according to example embodiments, however, light is incident on the rear surface of the semiconductor substrates 560, 660, 760, and 860. In other words, light is incident on a surface opposite the front surface, i.e., a surface opposite to the wiring layers 550, 650, 750 and 850, so the incident light may be transmitted to the photo detectors PD through a semiconductor layer, i.e., as opposed to being transmitted through an insulation layer. As such, absorption or interference of light reaching the photo detectors PD may be prevented or substantially minimized, as the light is not transmitted through insulation layers, e.g., through the wiring layers 550, 650, 750, and 850.

The wiring layers 550, 650, 750, and 850 may each have a structure in which a wiring and an interlayer insulation layer are stacked. The wiring is formed of a conductive material, e.g., a metal or an alloy of at least two metals. The interlayer insulation layer is formed of an insulation material, e.g., a silicon oxide. Multi-layer wirings may be formed by repeatedly forming wirings and interlayer insulation layers. The wiring layers 550, 650, 750, and 850 are respectively formed on the front surfaces of the semiconductor substrates 560, 660, 760, and 860, whereas the light filter layers 570, 670, 770, and 870 are respectively formed on the rear surfaces of the semiconductor substrates 560, 660, 760, and 860.

Active devices for transmitting and processing photoelectrically converted signals are formed on the front surfaces of the semiconductor substrates 560, 660, 760, and 860, whereas devices for receiving and transmitting light are formed on the rear surfaces of the semiconductor substrates 560, 660, 760, and 860. In other words, devices including a transmitting transistor, a resetting transistor, a driving transistor, and a selecting transistor and the wiring layers 550, 650, 750, and 850 are formed on the front surfaces of the semiconductor substrates 560, 660, 760, and 860. Furthermore, the light filter layers 570, 670, 770, and 870, which respectively include color filter layers 520, 620, 720 and 820, and lens layers 510, 610, 710, and 810, are formed on the rear surfaces of the semiconductor substrates 560, 660, 760, and 860.

The semiconductor substrates 560, 660, 760, and 860 include the first semiconductor layers 530, 630, 730 and 830, and the second semiconductor layers 540, 640, 740 and 840, respectively. Each of the first semiconductor layers 530, 630, 730, and 830, and the second semiconductor layers 540, 640, 740, and 840 may be formed of a semiconducting material. Examples of the semiconducting material may include a bulk, e.g., silicon, substrate, an epitaxial, e.g., silicon, substrate, or a silicon-on-insulator (SOI) substrate. In the semiconductor substrates 560, 660, 760, and 860, pixel regions are defined by pixel isolation layers 532, 632, 732, and 832, respectively.

In detail, the pixel isolation layers 532, 632, 732, and 832 are formed in the first semiconductor layers 530, 630, 730, and 830, respectively. The pixel isolation layers 532, 632, 732, and 832 may be vertically arranged in the first semiconductor layers 530, 630, 730, and 830, respectively, and may form boundaries between adjacent pixels. The pixel isolation layers 532, 632, 732, and 832 may be formed by a trench device isolation method, and may be formed of a material having a refraction index lower than that of a material of the first semiconductor layers 530, 630, 730, and 830. The trench device isolation method refers to a method of forming a trench with a suitable depth, followed by filling the trench with an insulation layer. The trench device isolation method may be a shallow trench isolation (STI) method or a deep trench isolation (DTI) method, in accordance with depths of trenches to be formed. As compared to local oxidization of silicon (LOCOS) method, the STI isolation method or the DTI isolation method may not form a bird's beak, i.e., an active region of a substrate may not be eroded and may be retained in the STI/DTI isolation methods. The pixel isolation layers 532, 632, 732, and 832 may be DTI layers formed in the first semiconductor layers 530, 630, 730, and 830 to extend from front surfaces of the first semiconductor layers 530, 630, 730, and 830 toward rear surfaces of the same.

Figure 5:
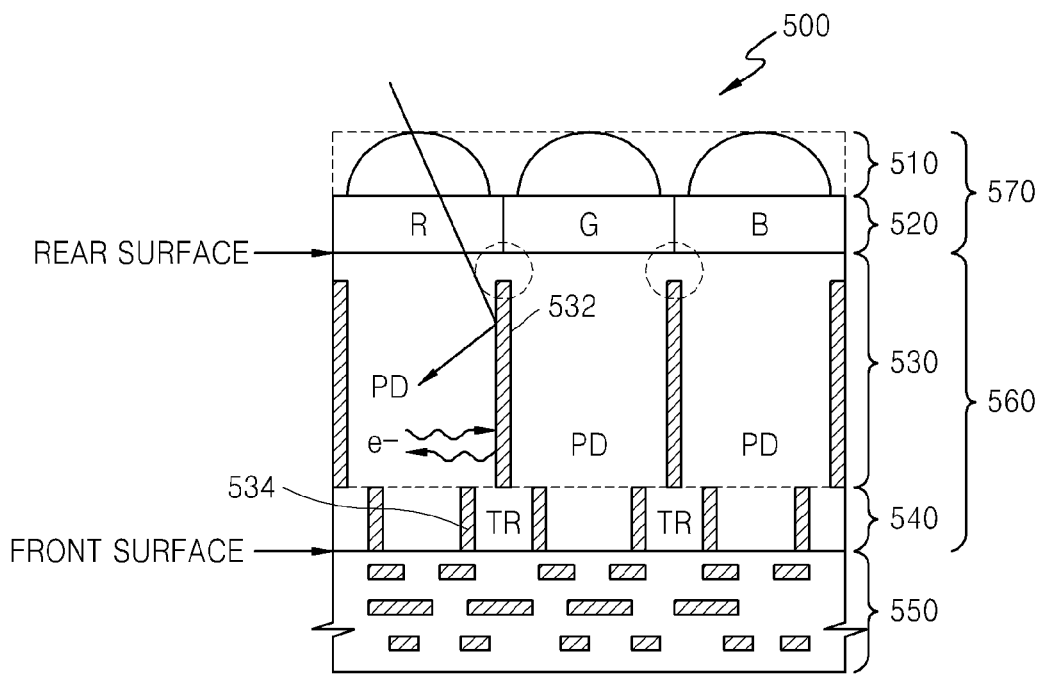
FIG. 5 illustrates a cross-sectional view of a backside illuminated image sensor according to an embodiment of the inventive concept.
Figures 7, 8:
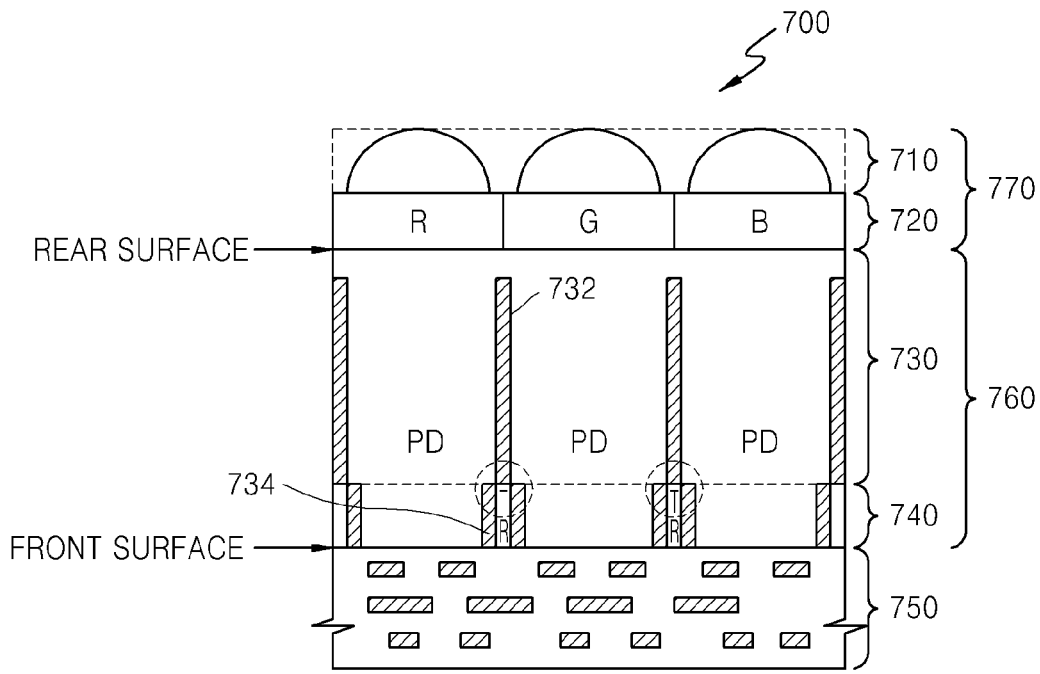
FIG. 7 illustrates a cross-sectional view of a backside illuminated image sensor according to another embodiment of the inventive concept.
FIG. 8 illustrates a cross-sectional view of a backside illuminated image sensor according to another embodiment of the inventive concept.

In detail, FIGS. 5 and 7 show that the pixel isolation layers 532 and 732 are respectively formed in the first semiconductor layers 530 and 730 from the surfaces of the first semiconductor layers 530 and 730 toward rear surfaces of the same to depths smaller than thicknesses of the first semiconductor layer 530 and 730. In other words, the pixel isolation layers 532 and 732 of the backside illuminated image sensors 500 and 700 may be separated from the rear surfaces of the semiconductor substrate 560 and 760 by several μm to dozens of μm, e.g., a portion of a respective first semiconductor layer 530 may be positioned between the rear surface of the substrate 560 and respective terminal edges of the pixel isolation layers 532 as illustrated by the dashed circles in FIG. 5.

Figure 6:
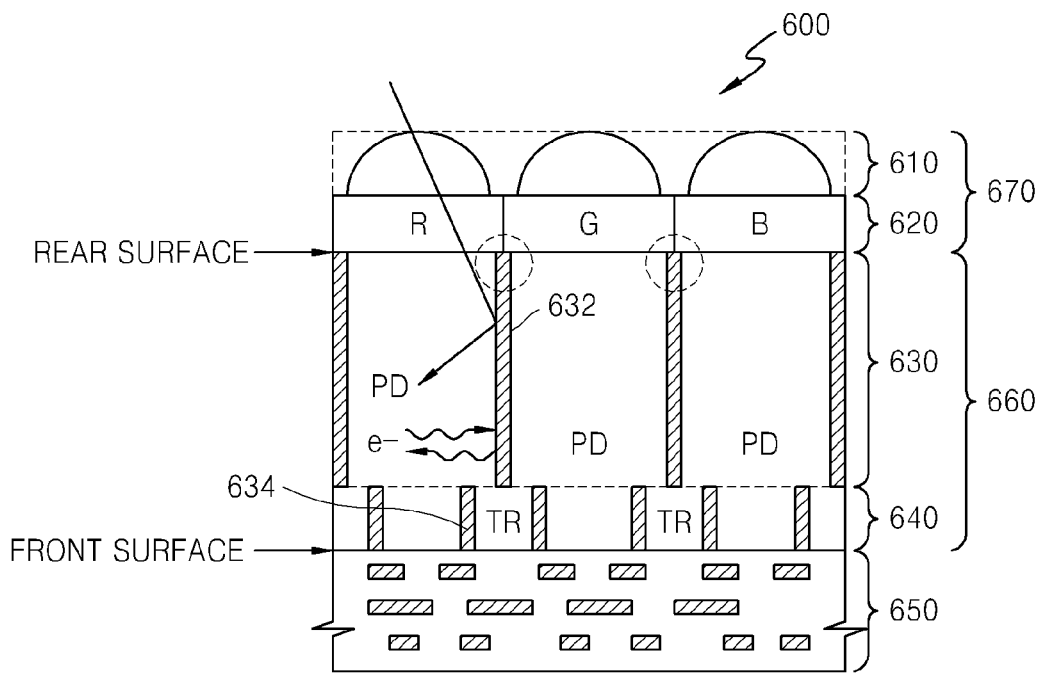
FIG. 6 illustrates a cross-sectional view of a backside illuminated image sensor according to another embodiment of the inventive concept.

FIGS. 6 and 8 show that the pixel isolation layers 632 and 832 are respectively formed in the first semiconductor layers 630 and 830 from the front surfaces of the first semiconductor layers 630 and 830 toward the rear surface of the same to depths that equal thicknesses of the first semiconductor layer 630 and 830. In other words, the pixel isolation layers 632 and 832 of the backside illuminated image sensors 600 and 800 may be substantially level with the front and rear surfaces of the semiconductor layers 630 and 830, respectively, e.g., the pixel isolation layers 632 and 832 may traverse through an entire thickness of the respective semiconductor layers 630 and 830.

Figure 9:
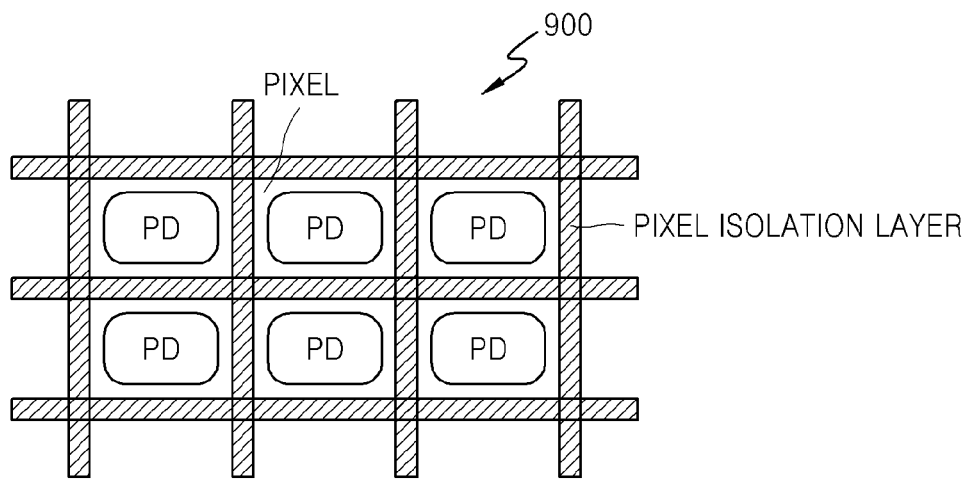
FIG. 9 illustrates a plan view of a photo detector and a pixel isolation layer in an APS array of a backside illuminated image sensor according to an embodiment of the inventive concept.

The pixel isolation layers 532, 632, 732, and 832 of the backside illuminated image sensors 500, 600, 700, and 800 isolate light incident on each of the photo detectors PD from adjacent photo detectors PD in the first semiconductor layers 530, 630, 730, and 830, thereby minimizing diffusion of light between adjacent photo detectors PD. Therefore, crosstalk between adjacent pixels may be reduced or eliminated. As shown in FIG. 9, the pixel isolation layers 532, 632, 732, and 832 may have a lattice structure to define a plurality of cells, so each cell may include one photo detector PD and may completely isolate one photo detector PD from adjacent photo detectors PD. Therefore, each of the photo detectors PD may be electrically and optically isolated. In other words, the pixel isolation layers 532, 632, 732, and 832 of the backside illuminated image sensors 500, 600, 700, and 800 may be formed to have complete lattice structures.

Furthermore, in the semiconductor substrates 560, 660, 760, and 860, active regions TR of active devices for transmitting and processing signals photoelectrically converted by the photo detectors PD may be defined, and device isolation layers 534, 634, 734, and 834 for isolating the active devices may be formed, respectively. The active devices may include transmitting transistors, resetting transistors, driving transistors, and selecting transistors. In detail, the device isolation layers 534, 634, 734, and 834 may be STI layers formed in the second semiconductor layers 540, 640, 740, and 840 from the front surfaces of the semiconductor substrates 560, 660, 760, and 860 toward the rear surfaces of the same. A plurality of active devices may be arranged on the front surfaces of the semiconductor substrates 560, 660, 760, and 860. Here, the active devices are formed by doping impurities into the second semiconductor layers 540, 640, 740, and 840 on the front surfaces of the semiconductor substrates 560, 660, 760, and 860, and by forming gate insulation layers and gate electrodes. Furthermore, the photo detectors PD may be arranged at a predetermined depth from the front surfaces of the semiconductor substrates 560, 660, 760, and 860. Therefore, the photo detectors PD, which are formed by doping impurities into the second semiconductor layers 540, 640, 740, and 840, may be either arranged in the second semiconductor layers 540, 640, 740, and 840 or arranged in both the first semiconductor layers 530, 630, 730, and 830 and the second semiconductor layers 540, 640, 740, and 840.

FIGS. 5 and 6 show that the device isolation layers 534 and 634 may be respectively formed in the second semiconductor layers 540 and 640 from the front surfaces of the semiconductor substrates 560 and 660 toward the rear surfaces of the same, and may be symmetrically arranged around the pixel isolation layers 532 and 632 corresponding thereto. In other words, the active device regions TR, in which transistors are to be formed, may be formed on imaginary lines extending from the pixel isolation layers 532 and 632 toward the front surface, and the device isolation layers 534 and 634 may be formed to be symmetrical to each other around the imaginary lines. The device isolation layers 534 and 634 may be spaced apart from the corresponding pixel isolation layers 532 and 632.

In other embodiments, the device isolation layers 734 and 834 formed in the second semiconductor layers 740 and 840 may not be separated from the corresponding pixel isolation layers 732 and 832, as illustrated in FIGS. 7 and 8. That is, the structure may be formed by suitably adjusting thicknesses of the active device regions TR, i.e., where transistors are to be formed, to correspond to thicknesses of the pixel isolation layers 732 and 832, and the device isolation layers 734 and 834 may be formed immediately adjacent to the active device regions TR. As such, the active device regions TR may be, e.g., completely, isolated by the device isolation layers 734 and 834 in the horizontal direction, and may be, e.g., completely, isolated by the pixel isolation layers 732 and 832 in the vertical direction.

The light filter layers 570, 670, 770, and 870 may be arranged on, e.g., directly on, the rear surfaces the semiconductor substrates 560, 660, 760, and 860. The light filter layers 570, 670, 770, and 870 may include the color filter layers 520, 620, 720 and 820, and the lens layers 510, 610, 710, and 810. The lens layers 510, 610, 710, and 810 may include a plurality of micro-lenses for focusing light incident on the rear surfaces of the semiconductor substrates 560, 660, 760, and 860 to the photo detectors PD in corresponding pixels. Only light having predetermined colors are selected by corresponding color filters R, G, and B from light incident via the micro-lenses, and the light having the predetermined colors are incident on the photo detectors PD of corresponding pixels.

Insulation layers (not shown) may be interposed between the semiconductor substrates 560, 660, 760 and 860, and respective light filter layers 570, 670, 770, and 870. The insulation layers may be passivation layers for protecting the semiconductor substrates 560, 660, 760, and 860. The insulation layers (not shown) may also prevent light from being scattered or reflected. In the case where the insulation layers function as light scattering preventing layers (not shown), the insulation layers may be formed as multi-layers in which materials with different refraction indices are stacked. For example, the insulation layers may be formed of stacked layers of oxide layers and nitride layers (oxide layer/nitride layer or nitride layer/oxide layer) or stacked layers of oxide layers and carbon-containing layers (SiC) (oxide layer/SiC or SiC/oxide layer). For example, the oxide layers may each be a borophosphosilicate glass (BPSG) layer, a phosphosilicate glass (PSG) layer, a borosilicate glass (BSG) layer, an undoped silicate glass (USG) layer, a tetraethyl orthosilicate (TEOS) layer, or a High Density Plasma (HDP) layer. The nitride layers may each be, e.g., a silicon nitride layer ($Si_xN_y$, where x and y are natural numbers) or a silicon oxynitride layer ($Si_xO_yN_z$, where x, y, and z are natural numbers).

FIG. 9 is a plan view showing a photo detector PD and a pixel isolation layer in an APS array of backside illuminated image sensors according to an embodiment of the inventive concept.

Referring to FIG. 9, the pixel isolation layer may be formed to have a lattice structure and define each of the pixels in the APS array to completely isolate the photo detectors PD of each of the pixels. According to embodiments of the inventive concept, the pixel isolation layer and active devices may be separately formed in a first semiconductor layer and a second semiconductor layer, respectively, and thus a location and a shape of the pixel isolation layer are not restricted by the active devices. Therefore, the pixel isolation layer may be formed to have a complete lattice structure, and thus each of the photo detectors PD may be, e.g., completely, isolated.

Figure 10A:
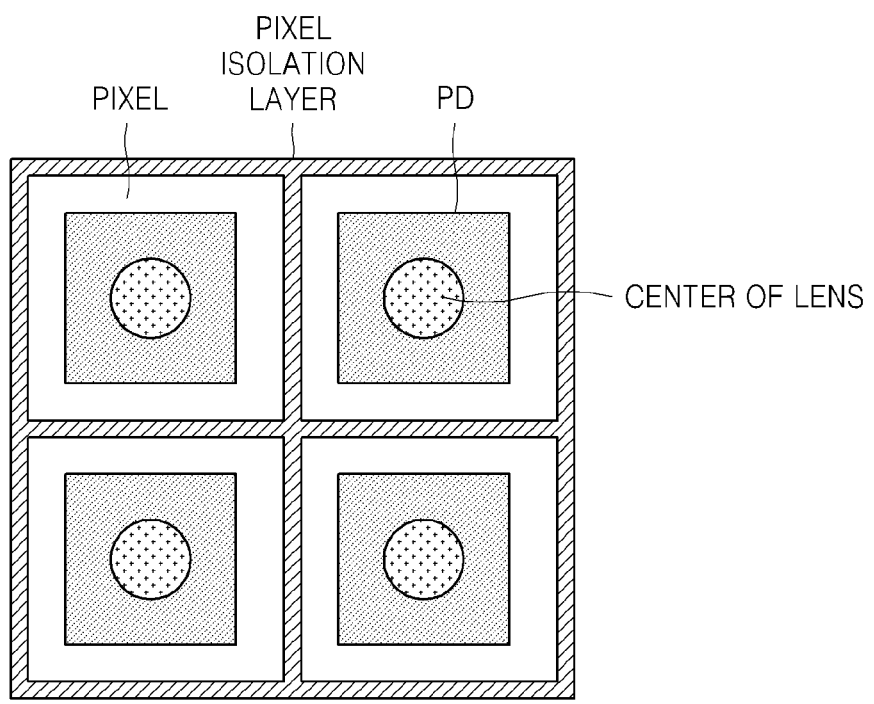
FIG. 10A illustrates a plan view of a backside illuminated image sensor according to an embodiment of the inventive concept.
Figures 10B, 11:
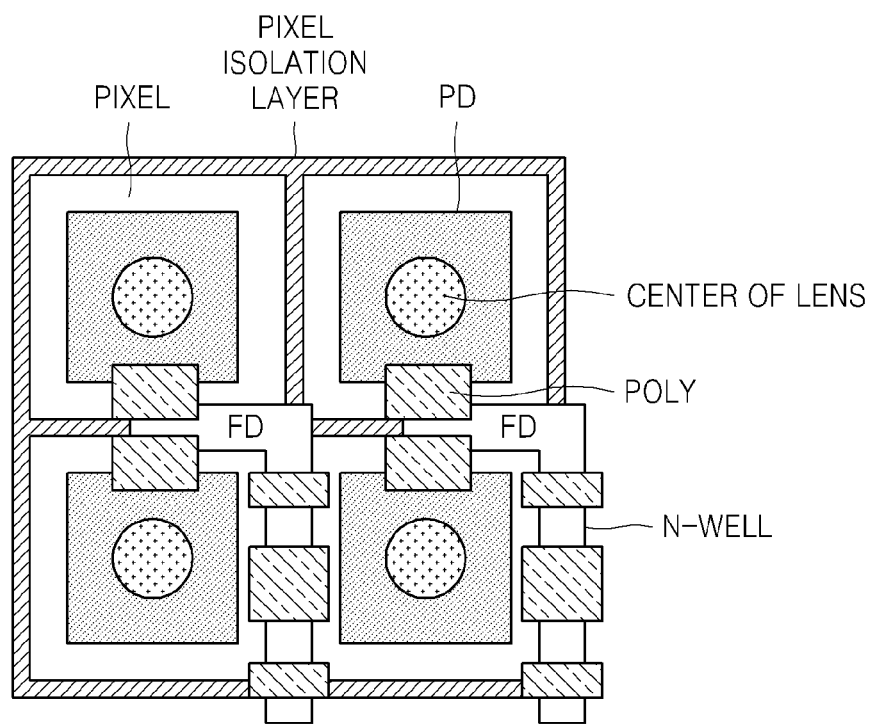
FIG. 10B illustrates a plan view of a backside illuminated image sensor according to another embodiment of the inventive concept.
FIGS. 11 through 19 illustrate cross-sectional views of stages in a method of manufacturing a backside illuminated image sensor according to an embodiment of the inventive concept.

FIGS. 10A and 10B are plan views of a backside illuminated image sensor according to embodiments of the inventive concept. FIG. 10A is a plan view showing a portion of the backside illuminated image sensor from a lens layer to a first semiconductor layer, whereas FIG. 10B is a plan view showing a portion of the backside illuminated image sensor from the lens layer to a second semiconductor layer.

Referring to FIG. 10A, each of the photo detectors PD may be completely isolated by the pixel isolation layer having a lattice structure. The reason for this is that, since the pixel isolation layer is formed in the first semiconductor layer and active devices are formed in the second semiconductor layer, formation of the pixel isolation layer is not restricted by locations of the active devices.

Referring to FIG. 10B, centers of each of the photo detectors PD and centers of micro-lenses may be aligned. The reason of this is that, since the pixel isolation layer is formed in the first semiconductor layer and the active devices are formed in the second semiconductor layer, formation of the active devices is not restricted by a location of the pixel isolation layer. Therefore, the photo detectors PD may be formed to be aligned with the corresponding micro-lenses, and then the active devices may be formed around the photo detectors PD. Since the formation of the active devices is not restricted by the location of the pixel isolation layer, the active devices may be formed in boundaries between pixels. As a result, a backside illuminated image sensor according to embodiments of the inventive concept may exhibit improved light concentrating efficiency due to alignment of the photo detectors PD with corresponding micro-lenses.

Although FIG. 10B shows a case in which two pixels share one FD region, four active devices may be formed to transmit and process signals photoelectrically converted by the photo detectors PD. The active devices are formed in an N-well for convenience of explanation, but the inventive concept is not limited thereto.

FIGS. 11 through 19 are cross-sectional views of stages in a method of manufacturing a backside illuminated image sensor according to an embodiment of the inventive concept.

First, referring to FIG. 11, a first supporting substrate may be prepared.

Figure 12:
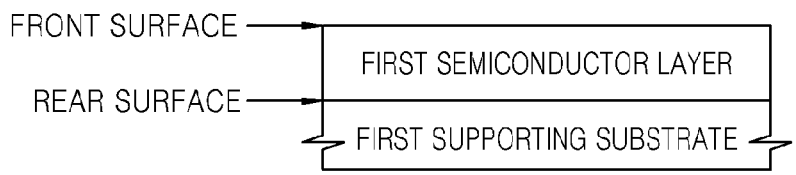

Next, referring to FIG. 12, a first semiconductor layer may be formed on the first supporting substrate. The first semiconductor layer may be, e.g., a bulk substrate, an epitaxial substrate, or an SOI substrate.

Figure 13A:
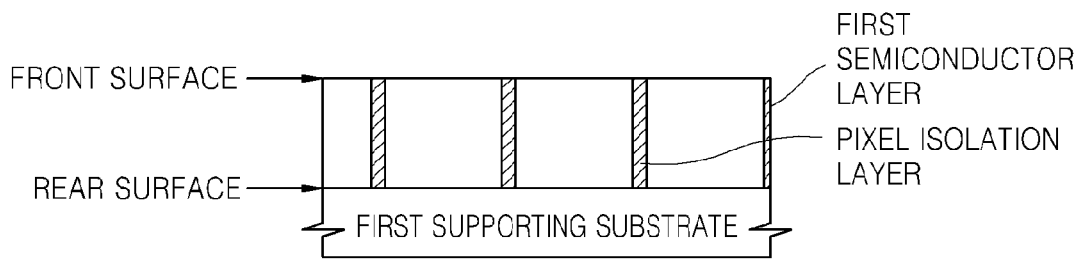
Figure 13B:
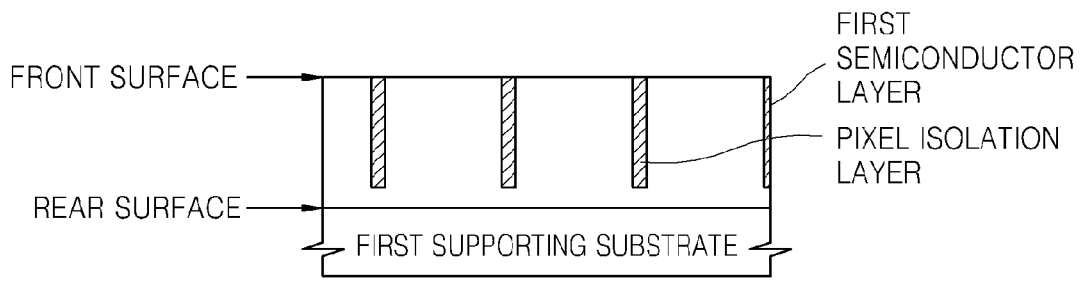

Next, referring to FIGS. 13A and 13B, a pixel isolation layer may be locally formed in the first semiconductor layer. Here, the pixel isolation layer may be formed by using, e.g., a LOCOS method, a trench device isolation method for higher integration, etc. The trench device isolation method refers to a method of forming a trench with a suitable depth and filling the trench with an insulation layer. The trench device isolation method may be a STI method or a DTI method, according to depths of the trenches to be formed. Compared to the LOCOS method, a STI isolation layer or a DTI isolation layer does not form a bird's beak, and thus, the active region of a substrate is not eroded and may be retained. For example, a trench may be formed by etching the first semiconductor layer by using a hard mask pattern, e.g., a silicon nitride layer, as an etching mask, and then filling the trench with an insulation layer, e.g., a silicon oxide layer.

The pixel isolation layer may be a DTI layer formed in the first semiconductor layer from a front side of the first semiconductor layer toward a rear side of the same. The pixel isolation layer isolates light incident on each of the photo detectors PD from each other in the first semiconductor layer to minimize light from being scattered between the photo detectors PD. Therefore, crosstalk between adjacent pixels may be reduced or eliminated. FIG. 13A shows that the pixel isolation layer may be formed to have a depth equal to a thickness of the first semiconductor layer, whereas FIG. 13B shows that the pixel isolation layer may be formed to have a depth smaller than the thickness of the first semiconductor layer.

Figure 14:
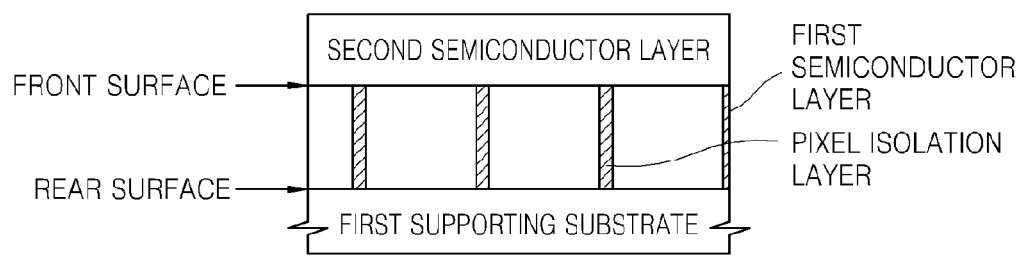

Next, referring to FIG. 14, a second semiconductor layer may be formed on the first semiconductor layer. The second semiconductor layer may be, e.g., a bulk substrate, an epitaxial substrate, or a SOI substrate.

Figure 15:
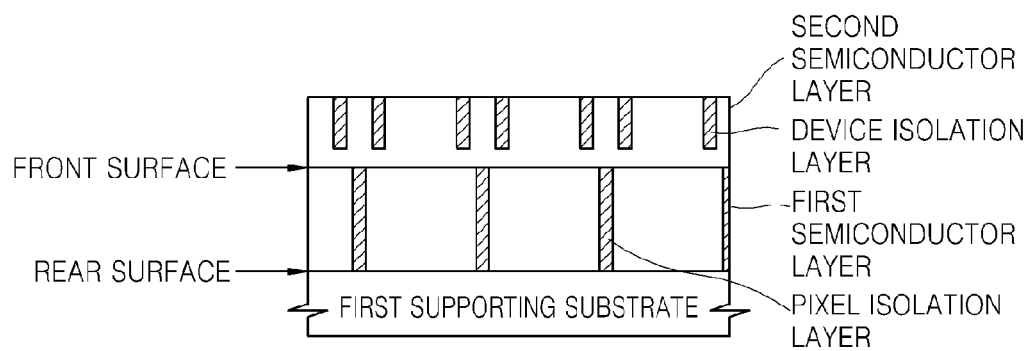

Next, referring to FIG. 15, a device isolation layer may be locally formed in the second semiconductor layer. Here, although the device isolation layer may be formed by using the LOCOS method, the pixel isolation layer may also be formed by using the trench isolation method, which is advantageous for higher integration. The trench isolation method refers to a method of forming a trench with a suitable depth and filling the trench with an insulation layer. The trench isolation method may be the STI method or the DTI method, in accordance with depths of trenches to be formed. Compared to the LOCOS method, the STI isolation method or the DTI isolation method forms no bird's beak, so the active region of the substrate is not eroded and may be retained. For example, a trench may be formed by etching the second semiconductor layer by using a hard mask pattern, e.g., a silicon nitride layer, as an etching mask, and then the trench may be filled with an insulation layer, e.g., a silicon oxide layer. The device isolation layer may be a STI layer formed in the second semiconductor layer from a front surface of the second semiconductor layer toward a rear surface of the same. The photo detectors PD, which are formed by doping impurities into the second semiconductor layer, may be formed in the second semiconductor layer or formed in both the first semiconductor layer and the second semiconductor layer. Furthermore, active devices for transmitting and processing signals photoelectrically converted by the photo detectors may be formed in the second semiconductor layer. To form the active devices, the second semiconductor layer may be doped with impurities, and a gate insulation layer and a gate electrode may be formed.

Figure 16:
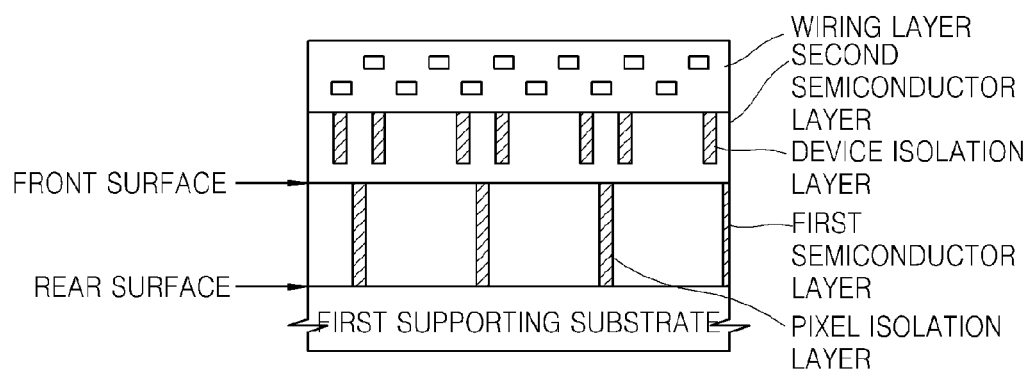

Next, referring to FIG. 16, a wiring layer may be formed on the second semiconductor layer. The wiring layer may have a structure in which a wiring and an interlayer insulation layer are stacked. The wiring may be formed of a conductive material, e.g., a metal or an alloy of at least two metals. The wiring may be formed of, e.g., Al. The interlayer insulation layer may be formed of an insulation material, e.g., a silicon oxide. Multi-layer wirings may be formed by repeatedly forming wirings and interlayer insulation layers. The multi-layer wirings may contact each other via contacts. Contact plugs may be formed in corresponding interlayer insulation layers by using a damascene method, and may be formed of a conductive material, e.g., a polycrystalline silicon layer doped with impurity ions, a metal, or an alloy of at least two metals, to electrically interconnect vertically stacked wiring layers. The contact plugs may be formed of, e.g., W. The interlayer insulation layers may be formed of an oxide layer, e.g., at least one of a BPSG layer, a PSG layer, a BSG layer, an USG layer, a TEOS layer, or a HDP layer or stacked layers in which two or more of the oxide layers are stacked.

Furthermore, the interlayer insulation layer may be planarized by using a CMP method after the interlayer insulation layer is deposited. A passivation layer may be formed on the interlayer insulation layer. Here, the passivation layer may be formed of an oxide layer, e.g., at least one of a BPSG layer, a PSG layer, a BSG layer, an USG layer, a TEOS layer, or a HDP layer. Furthermore, the passivation layer may be formed of a nitride layer or a stacked layer in which an oxide layer and a nitride layer are stacked. Next, the passivation layer may be planarized. Here, the CMP method may be used for the planarization of the passivation layer.

Figure 17:
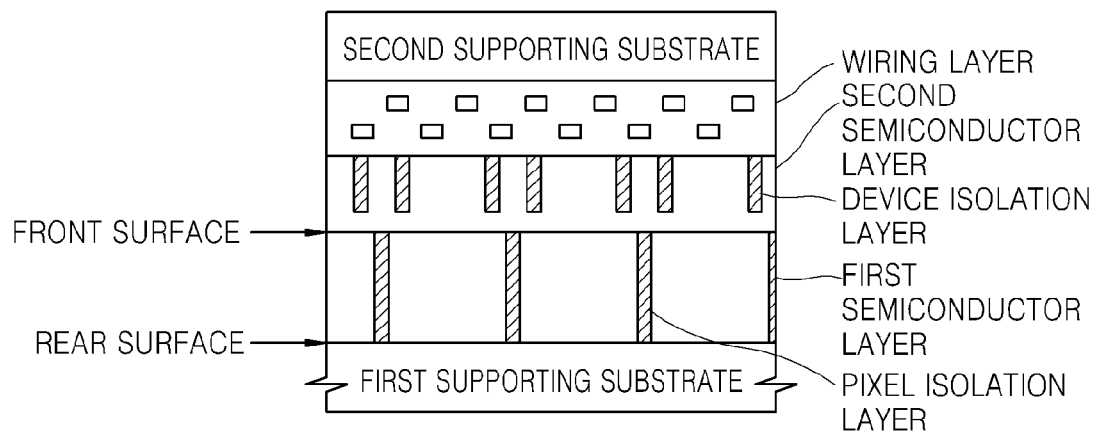

Next, referring to FIG. 17, a second supporting substrate may be adhered onto the wiring layer to support an end of the wiring layer.

Figure 18:
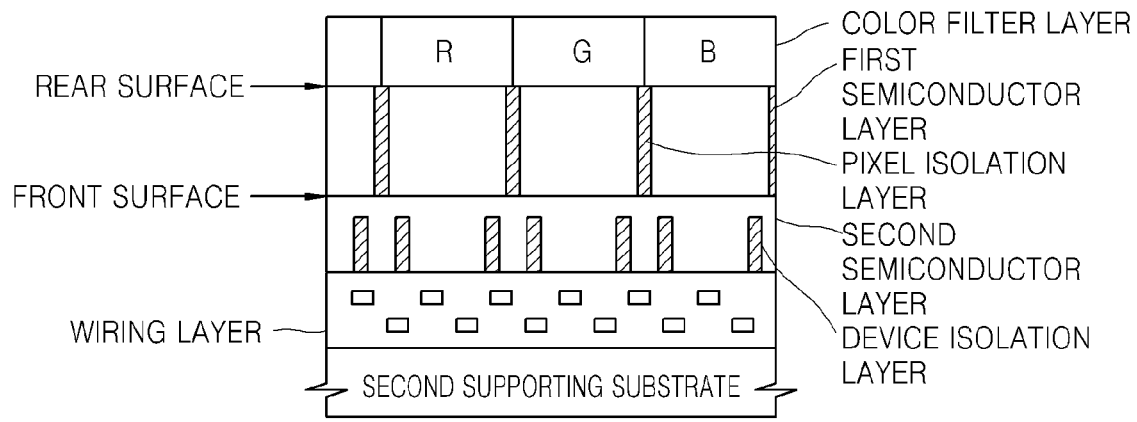

Next, referring to FIG. 18, the multi-layer structure including the first supporting substrate and the second supporting substrate may be turned upside down, so that the first supporting substrate becomes an upper layer and the second supporting substrate becomes a lower layer. Next, the first supporting substrate may be removed by shaving hundreds of μm off the first supporting substrate, e.g., by using a grinder and etching the remaining (dozens of μm) first supporting substrate.

After the first supporting substrate is removed, a light filter layer may be formed on the rear side of the first semiconductor layer. The light filter layer may include a lens layer and a color filter layer. In detail, referring to FIG. 18, the color filter layer may be formed on the rear side of the first semiconductor layer. Next, referring to FIG. 19, the lens layer may be formed on the color filter layer. The lens layer includes a plurality of micro-lenses for focusing light to be incident on the rear surface of the first semiconductor layer, i.e., toward the photo detectors PD in corresponding pixels. Only light having predetermined colors are selected by corresponding color filters of the color filter layer from light incident via the micro-lenses, and the light having the selected colors is incident on the photo detectors PD of corresponding pixels. The color filter layer includes a plurality of color filters corresponding to each of the photo detectors PD.

Prior to the formation of the color filter layer, an insulation layer (not shown) may be formed on the rear side of the first semiconductor layer. The insulation layer may be a passivation layer for protecting the semiconductor layer. Furthermore, the insulation layer may be a planarized layer. The planarized layer may be formed of a material with excellent light transmittance, e.g., a polyimide-based material or a poly-acrylic material. The insulation layer may also prevent light from being scattered or reflected. In the case where the insulation layer functions as a light scattering preventing layer (not shown) or an anti-reflection layer (not shown), the insulation layer may be formed as multi-layers in which materials with different refraction indexes are stacked. For example, the insulation layer may be formed of stacked layers of oxide layers and nitride layers (oxide layer/nitride layer or nitride layer/oxide layer) or stacked layers of oxide layers and carbon-containing layers (SiC) (oxide layer/SiC or SiC/oxide layer). Here, the oxide layers may each be a BPSG layer, a PSG layer, a BSG layer, an USG layer, a TEOS layer, or a HDP layer. The nitride layers may each be a silicon nitride ($Si_xN_y$, where x and y are natural numbers) layer or silicon oxynitride ($Si_xO_yN_z$, where x, y, and z are natural numbers).

Figure 19:
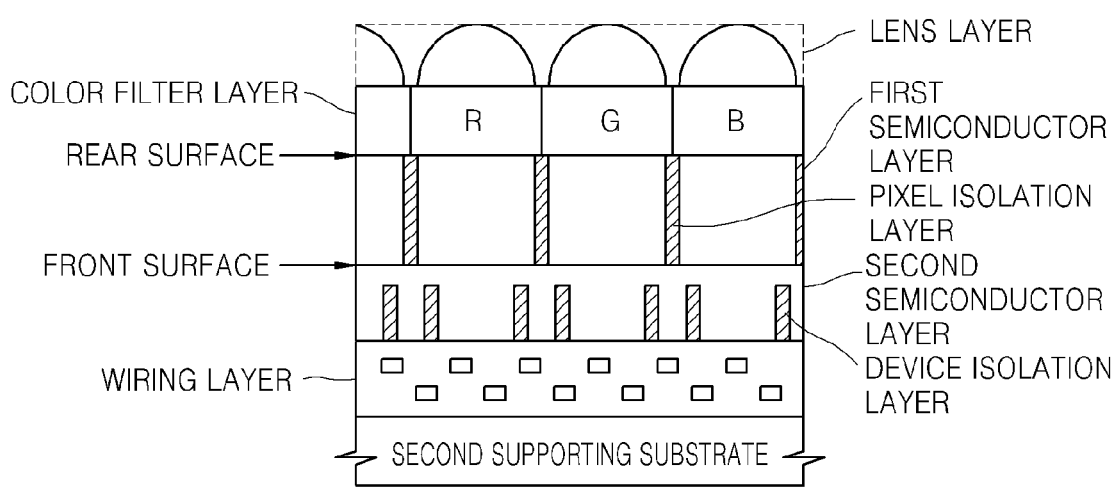

Referring to FIG. 19, the lens layer may be formed after the color filter layer is formed. The lens layer may be formed in such a way that a plurality of micro-lenses having a constant curvature and convex upward correspond to the photo detectors PD, respectively. A planarized layer may be formed after the color filter layer is formed and before the lens layer is formed. The planarized layer may be formed of a material with excellent light transmittance, e.g., a polyimide-based material or a poly-acrylic material. Next, an operation for removing surface residues on the lens layer may be performed. Furthermore, a baking operation may be performed to maintain shapes of the micro-lenses.

In contrast to example embodiments, in a conventional image sensor, colors may be mixed due to crosstalk. For example, when conventional photo diodes in pixels are separated from each other via a doping profile, i.e., as opposed to a pixel isolation layer, the barrier formed by the doping impurities may not be sufficiently high, thereby failing to completely eliminate crosstalk.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a backside illuminated image sensor having a pixel array, the method comprising:
    forming a first isolation layer in a first semiconductor layer, such that the first isolation layer defines pixels of the pixel array in the first semiconductor layer;
    forming a second semiconductor layer on a first surface of the first semiconductor layer;
    forming a second isolation layer in the second semiconductor layer, such that the second isolation layer defines active device regions in the second semiconductor layer;
    forming photo detectors and circuit devices by implanting impurities into a first surface of the second semiconductor layer, the first surface of the second semiconductor layer facing away from the first semiconductor layer;
    forming a wiring layer on the first surface of the second semiconductor layer; and
    forming a light filter layer on a second surface of the first semiconductor layer, the second surface of the first semiconductor layer being opposite the first surface of the first semiconductor layer, wherein the second isolation layer is between the first isolation layer and the wiring layer.

2. The method as claimed in claim 1, wherein forming the second semiconductor layer includes using an epitaxial method.

3. The method as claimed in claim 2, wherein the first semiconductor layer is formed by using an epitaxial method.

4. The method as claimed in claim 3, wherein forming the light filter layer includes:
    forming the first semiconductor layer on a first supporting substrate;
    forming a second supporting substrate on a surface of the wiring layer facing away from the second semiconductor layer;
    removing the first supporting substrate from the first semiconductor layer;
    forming a color filter layer on the second surface of the first semiconductor layer; and
    forming a lens layer on the color filter layer.

5. The method as claimed in claim 4, wherein forming the first isolation layer includes forming a trench-type insulation layer.

6. The method as claimed in claim 5, wherein forming the first isolation layer includes using a material having a refraction index lower than that of a material of the first semiconductor layer.

7. The method as claimed in claim 6, wherein the first isolation layer is formed to extend from the first surface of the first semiconductor layer toward the second surface of the first semiconductor layer, a length of the first isolation layer being substantially equal a thickness of the first semiconductor layer.

8. The method as claimed in claim 6, wherein the first isolation layer is formed to extend from the first surface of the first semiconductor layer toward the second surface of the first semiconductor layer, a length of the first isolation layer being shorter than a thickness of the first semiconductor layer.

9. The method as claimed in claim 6, wherein the first isolation layer is formed to have a lattice structure surrounding each of the pixels of the pixel array.

10. The method as claimed in claim 4, wherein the photo detectors are formed to be aligned with corresponding micro-lenses of the lens layer.

11. The method as claimed in claim 10, wherein a center of each of the photo detectors is aligned with a center of each corresponding pixel of the pixel array.

12. The method as claimed in claim 11, wherein each photo detector is a photo diode, a photo transistor, a photo gate, or a pinned photo diode (PPD).

13. The method as claimed in claim 11, wherein active regions of the circuit devices are formed to be symmetric around an imaginary line extending from the first isolation layer.

14. The method as claimed in claim 13, wherein a first part of the photo detector is formed in the first semiconductor layer and a second part of the photo detector is formed in the second semiconductor layer.

15. The method as claimed in claim 14, wherein at least two of the pixels share a floating diffusion (FD) region.

16. The method as claimed in claim 15, wherein the circuit devices include:
    transmitting transistors for transmitting charges accumulated in the corresponding photo detectors to the corresponding FD regions;
    resetting transistors for initializing potentials of the corresponding FD regions;

driving transistors for amplifying changes of potentials of the corresponding FD regions; and selecting transistors for outputting output signals of the corresponding driving transistors in response to corresponding row selecting signals.

17. The method as claimed in claim 1, wherein the first isolation layer is formed to have a side surface to reflect light passing through the light filter layer.

18. The method as claimed in claim 1, wherein at least one of the circuit devices overlaps the first isolation layer.

19. The method as claimed in claim 1, wherein the first isolation layer is longer than the second isolation layer.

20. The method as claimed in claim 1, wherein the first isolation layer is between at least one of the active devices and the light filter layer.

21. The method as claimed in claim 1, wherein the active devices and the first isolation layer are at different levels.

* * * * *